(12) United States Patent
You et al.

(10) Patent No.: US 12,249,617 B2
(45) Date of Patent: Mar. 11, 2025

(54) DISPLAY PANEL AND DISPLAY DEVICE

(71) Applicant: LG DISPLAY CO., LTD, Seoul (KR)

(72) Inventors: Seungcheol You, Gyeonggi-do (KR);
Wonrae Kim, Gyeonggi-do (KR);
SeungBum Lee, Gyeonggi-do (KR)

(73) Assignee: LG Display Co., Ltd. (KR)

( * ) Notice: Subject to any disclaimer, the term of this patent is extended or adjusted under 35 U.S.C. 154(b) by 642 days.

(21) Appl. No.: 17/528,762

(22) Filed: Nov. 17, 2021

(65) Prior Publication Data

US 2022/0199678 A1 Jun. 23, 2022

(30) Foreign Application Priority Data

Dec. 23, 2020 (KR) .......................... 10-2020-0181589

(51) Int. Cl.
*H01L 27/15* (2006.01)
*H01L 33/10* (2010.01)
*H01L 33/50* (2010.01)

(52) U.S. Cl.
CPC ............ *H01L 27/156* (2013.01); *H01L 33/10* (2013.01); *H01L 33/502* (2013.01)

(58) Field of Classification Search
CPC ...... H01L 27/156; H01L 33/10; H01L 33/502; H01L 25/0753; H01L 33/42; H01L 33/46; H01L 33/06; H01L 33/52; H01L 33/58; H01L 33/32; H01L 33/50; H01L 33/507; H01L 33/60; H01L 25/075; H01L 33/30; H01L 25/13; H10K 59/35; H10K 59/38; H10K 50/856; H10K 2102/331
See application file for complete search history.

(56) References Cited

U.S. PATENT DOCUMENTS

| | | | |
|---|---|---|---|
| 2019/0189864 A1* | 6/2019 | Ye | H01L 33/504 |
| 2020/0168667 A1* | 5/2020 | Kim | H10K 59/50 |
| 2020/0303896 A1* | 9/2020 | Ohta | B25J 19/022 |
| 2021/0028327 A1* | 1/2021 | Lin | H01L 25/0753 |
| 2021/0028383 A1* | 1/2021 | Manders | H10K 59/35 |

\* cited by examiner

*Primary Examiner* — Jonathan Han
(74) *Attorney, Agent, or Firm* — Fish & Richardson P.C.

(57) ABSTRACT

A display apparatus includes a display panel on which a plurality of pixels are displayed, a plurality of signal lines to which a signal required to drive the display panel is supplied, and an electrostatic discharge circuit connected between each of the plurality of signal lines and the electrostatic discharge line, and the electrostatic discharge circuit includes first and second current paths between the signal line and the electrostatic discharge line, a first electrostatic discharge circuit connected to the first current path, including a plurality of first thin film transistors having a first gate electrode connected to the second current path and a second gate electrode connected to the first current path, and a second electrostatic discharge circuit connected to the second current path, including at least one second thin film transistor having a first gate electrode connected to the first current path and a second gate electrode connected to the first current path.

12 Claims, 11 Drawing Sheets

DISPLAY PANEL AND DISPLAY DEVICE

CROSS-REFERENCE TO RELATED APPLICATION

This application claims the priority of Korean Patent Application No. 10-2020-0181589, filed on Dec. 23, 2020, which is hereby incorporated by reference in its entirety for all purposes as if fully set forth herein.

BACKGROUND

Field of the Disclosure

The present disclosure relates to a display panel and a display device

Description of the Background

Along with the development of the information society, demand for image display devices is increasing. In this regard, a range of display devices, such as liquid crystal display (LCD) devices, organic light-emitting diode (OLED) display devices, and quantum dot display devices, are used.

Display devices reproduce colors by a variety of methods. For example, a wavelength conversion layer converting light having a specific wavelength range, emitted from a light source, into light having a different wavelength may be used.

In a display device expressing colors using a wavelength conversion layer, low light conversion efficiency of the wavelength conversion layer disadvantageously lowers luminance.

SUMMARY

Accordingly, the present disclosure is to provide a display panel and a display device each having high luminance.

In addition, the present disclosure is to provide a display panel and a display device each having high luminance and superior color reproducibility even in the case that a wavelength conversion layer including quantum dots is used.

According to an aspect of the present disclosure, a display panel includes a substrate, a first reflector, a planarization layer, a first transparent electrode, an emissive layer, a second transparent electrode, a wavelength conversion layer, and a second reflector.

A first subpixel, a second subpixel, and a third subpixel may be defined on the substrate. The first subpixel expresses a first color, the second subpixel expresses a second color, and the third subpixel expresses a third color.

The first reflector may be located on the substrate. In addition, the first reflector may have a hole corresponding to the first subpixel.

The planarization layer may be located on the substrate, and may occupy the hole corresponding to the first subpixel.

The first transparent electrode may be located on the first reflector and on the planarization layer.

The emissive layer may be located on the first transparent electrode, and may emit light having the first color in the first subpixel, the second subpixel, and the third subpixel The second transparent electrode may be located on the emissive layer.

The wavelength conversion layer may be located on the second transparent electrode. In addition, the wavelength conversion layer may convert light having the first color into light having the second color in the second subpixel. The wavelength conversion layer may also convert light having the first color into light having the third color in the third subpixel.

The second reflector may be located on the wavelength conversion layer.

The first reflector reflects light having the first color and allow light having the second color and light having the third color to pass therethrough.

The first reflector may be a distributed Bragg reflector (DBR). The DBR may include refractive index layer pairs each comprised of a low refractive index layer and a high refractive index layer. The DBR may also have a structure in which the low refractive index layers and the high refractive index layers are stacked on each other in an alternating manner.

The number of the refractive index layer pairs of the distributed Bragg reflector may be 10 to 20.

The ratio of the thickness of the low refractive index layers with respect to the thickness of the high refractive index layers in the distributed Bragg reflector may be substantially 2:1.

The wavelength conversion layer may include a first quantum dot in the second subpixel and a second quantum dot in the third subpixel.

The first color may be blue, the second color may be green, and the third color may be red.

In another aspect, aspects of the present disclosure may provide a display device including the above-described display panel and a controller driving the display panel.

According to aspects of the present disclosure, it is possible to provide a display panel and a display device each having high luminance and superior color reproducibility even in the case that a wavelength conversion layer having low light conversion efficiency is used.

In addition, according to aspects of the present disclosure, it is possible to provide a display panel and a display device each having high luminance by including a first reflector and a second reflector.

BRIEF DESCRIPTION OF THE DRAWINGS

The above and other features and advantages of the present disclosure will be more clearly understood from the following detailed description, taken in conjunction with the accompanying drawings, in which.

DETAILED DESCRIPTION

Figure 1:
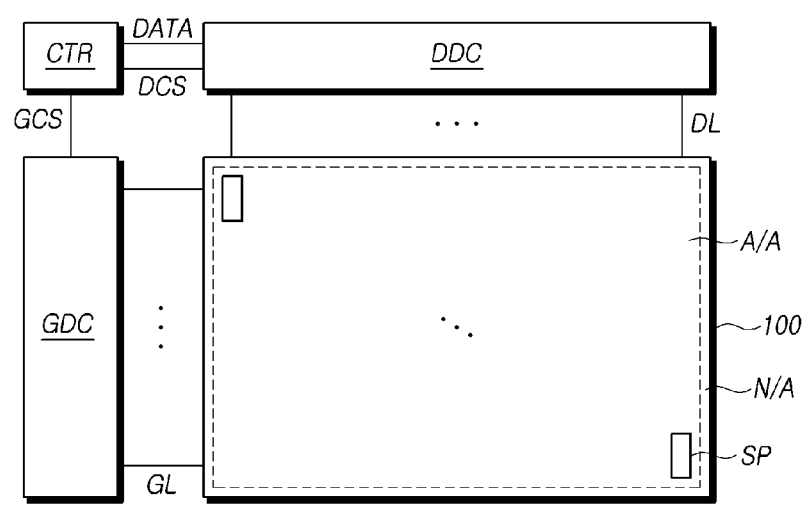
FIG. 1 is a diagram illustrating the structure of a display device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to", "contacts or overlaps", etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, and manufacturing methods, these terms may be used to describe non-consecutive or non-sequential processes or operations unless the term "directly" or "immediately" is used together.

In addition, when any dimensions, relative sizes, etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating the structure of an aspect of a display device according to the present disclosure.

Referring to FIG. 1, a display device 10 according to aspects of the present disclosure may include: a display panel 100 including an active area A/A and a non-active area N/A; and a control unit for driving the display panel 100, such as a gate driver circuit GDC, a data driver circuit DDC, and a controller CTR.

In the display panel 100, a plurality of gate lines GL and a plurality of data lines DL may be provided, and a plurality of subpixels SP may be disposed in areas in which the gate lines GL intersect the data lines DL. In addition, the display panel 100 may be a liquid crystal panel. The liquid crystal panel may include pixel electrodes, a common electrode, and a liquid crystal layer disposed between the pixel electrodes and the common electrode. The liquid crystal layer may display an image by changing the molecular alignments of liquid crystals in response to voltages applied to the pixel electrodes and the common electrode so as to block light or allow light to pass therethrough.

The gate driver circuit GDC is controlled by the controller CTR. The gate driver circuit GDC may control the driving timing of the plurality of subpixels SP by sequentially outputting scan signals to the plurality of gate lines GL disposed in the display panel 100.

The data driver circuit DDC may receive image data from the controller CTR and convert the image data into an analog data voltage. The data driver circuit DDC may output the data voltage to the data lines DL at points in time at which a scan signal is applied through the gate lines GL so that each of the subpixels SP expresses brightness according to the image data.

The controller CTR may control the operation of the gate driver circuit GDC and the data driver circuit DDC by supplying a variety of control signals to the gate driver circuit GDC and the data driver circuit DDC.

The display device 10 may further include a power management integrated circuit (IC) supplying a variety of voltages or currents to the display panel 100, the gate driver circuit GDC, the data driver circuit DDC, and the like or controlling a variety of voltages or currents to be supplied.

The display device 10 according to aspects of the present disclosure may be an organic light-emitting display device, an LCD device, a plasma display device, or the like.

When the display device 10 according to aspects is an OLED display device, each of the subpixels SP arranged in the display panel 100 may include a light-emitting diode (OLED) serving as a self-luminous device and a circuit component, such as a driver transistor, for driving the OLED.

The type and number of circuit components of each of the subpixels may be determined variously depending on functions that can be provided, the design, or the like.

Figure 2:
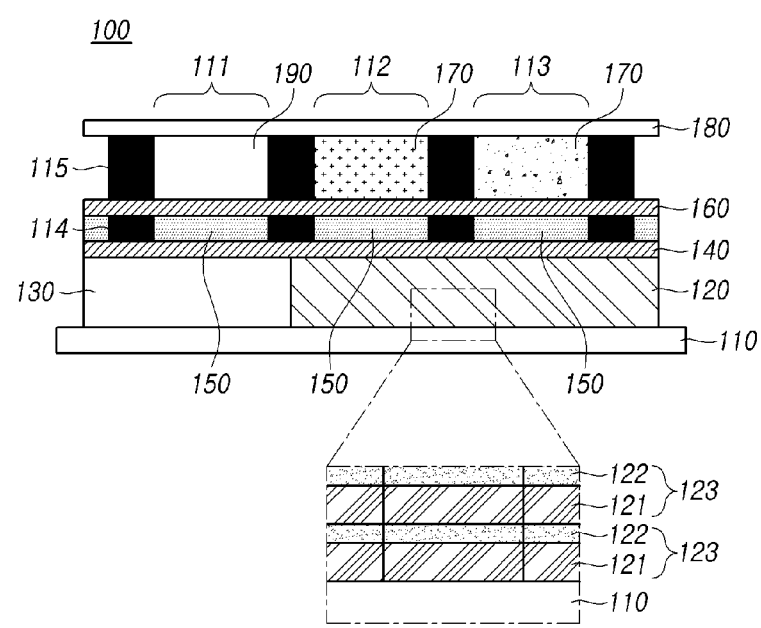
FIGS. 2 and 3 are schematic views illustrating the cross-sectional shape of the display panel according to aspects of the present disclosure.

FIG. 2 is a schematic view illustrating the cross-sectional shape of the display panel according to aspects of the present disclosure.

Referring to FIG. 2, the display panel 100 includes a substrate 110, a first reflector 120, a planarization layer 130, a first transparent electrode 140, an emissive layer 150, a second transparent layer 160, a wavelength conversion layer 170, and a second reflector 180.

In the substrate 110, a first subpixel 111, a second subpixel 112, and a third subpixel 113 are defined. The first subpixel 111 expresses a first color, the second subpixel 112 expresses a second color, and the third subpixel 113 expresses a third color. Each subpixel expressing a specific color may mean that the display panel emits light having a specific color in a specific subpixel area of the active area.

Circuit components for driving the subpixels of the display panel, as described above with reference to FIG. 1, may be located on the substrate 110. For example, the substrate 110 may be a thin-film transistor (TFT) substrate.

The first reflector 120 is located on the substrate 110. In addition, the first reflector 120 has a hole corresponding to the first subpixel 111. The first reflector 120 having the hole corresponding to the first subpixel 111 may mean that the hole is provided on a path along which light emitted from the emissive layer 150 located in the first subpixel 111 travels so that the light emitted from the emissive layer 150 located in the first subpixel 111 does not pass through the first reflector 120.

The first reflector 120 reflects light having the first color while allowing light having the second color and light having the third color to pass therethrough. The expression the "specific light having a specific color" used herein means that the specific light has a wavelength by which the specific light may be recognized as having a specific color. Since the first reflector 120 reflects light having a specific color and allows light having another color to pass therethrough, the first reflector 120 is characterized by only reflecting light having a specific wavelength and allowing light having the other wavelengths to pass therethrough. Since the first reflector 120 has this characteristic, even in the case that the wavelength conversion layer 170 has low light conversion efficiency, light having the first color, not converted in the wavelength conversion layer 170, may be redirected to the wavelength conversion layer 170 so as to be reused, thereby improving the luminance of the display panel 100.

The first reflector 120 may be a distributed Bragg reflector (DBR). The DBR may include refractive index layer pairs 123 each comprised of a low refractive index layer 121 and a high refractive index layer 122. That is, the DBR may have a structure in which the low refractive index layers 121 and the high refractive index layers 122 are stacked on each other in an alternating manner.

The DBR may include 10 to 20 refractive index layer pairs 123 each comprised of a low refractive index layer and a high refractive index layer. When the number of the refractive index layer pairs of the DBR meets this range, the DBR may effectively reflect light having the first color while effectively allowing light having the second color and light having the third color to pass therethrough, thereby improving the luminance of the display panel and reducing time and cost for a display panel fabrication process.

In the DBR, the ratio L:H of the thickness L of the low refractive index layers 121 with respect to the thickness H of the high refractive index layers 122 may be substantially 2:1. When the ratio of the thickness of the low refractive index layers 121 with respect to the thickness of the high refractive index layers 122 meets this ratio, the DBR may effectively reflect light having the first color while effectively allowing light having the second color and light having the third color to pass therethrough.

The planarization layer 130 is located on the substrate 110. In addition, the planarization layer 130 occupies the hole corresponding to the first subpixel 111 of the first reflector 120. As the planarization layer 130 occupies the hole of the first reflector 120, one surface of the substrate 110 on which the first reflector 120 is provided may be planarized.

Differently from that illustrated in FIG. 2, the planarization layer 130 may also be located on the first reflector 120 while occupying the hole corresponding to the first subpixel 111 of the first reflector 120.

The first transparent electrode 140 is located on the first reflector 120 and also on the planarization layer 130. Differently from that illustrated in FIG. 2, the first transparent electrode 140 may be provided in a pattern corresponding to the areas of the subpixels 111, 112, and 113, instead of being provided on the entirety of one surface of the substrate 110. For example, a circuit component, such as a driver transistor for driving a light-emitting device, may be located in each of the subpixels of the substrate 110, and the first transparent electrode 140 may be electrically connected to the driver transistor.

A material of the first transparent electrode 140 is not limited to a specific type as long as the material has a visible light transmittance of 80% or more at 550 nm, a surface resistance of 1000 Ω/sq or less, and a conductivity of 1000 S/m or more. For example, the first transparent electrode 140 may contain at least one from among indium tin oxide (ITO), graphene, Pedot:pss, silver nanowire, and carbon nanotube (CNT).

The emissive layer 150 is located on the first transparent electrode 140. In addition, the emissive layer 150 emits light having the first color from the first subpixel 111, the second subpixel 112, and the third subpixel 113.

The emissive layer 150 is a component of, for example, the light-emitting device located on the substrate 110. The emissive layer 150 may be an organic layer of an organic light-emitting diode (OLED).

A bank layer 114 may be located on the first transparent electrode 140. The bank layer 114 may be a pixel defining layer located to correspond to the first subpixel 111, the second subpixel 112, and the third subpixel 113.

The second transparent layer 160 is located on the emissive layer 150. Details of the material of the second transparent layer 160 are the same as those of the material of the first transparent electrode 140 described above. The second transparent layer 160 may be provided, for example, on the entirety of one surface of the substrate 110.

The wavelength conversion layer 170 is located on the second transparent layer 160. In addition, the wavelength conversion layer 170 in the second subpixel 112 converts light having the first color to light having the second color, whereas the wavelength conversion layer 170 in the third subpixel 113 converts light having the first color to light having the third color.

The wavelength conversion layer 170 may include a first quantum dot in the second subpixel 112 and a second quantum dot in the third subpixel 113. For example, the wavelength conversion layer 170 may include an overcoat layer as a transparent organic layer, include the first quantum dot in the overcoat layer in the second subpixel 112, and include the second quantum dot in the overcoat layer in the third subpixel 113. The wavelength conversion layer 170 may only include a transparent overcoat layer 190 in the first subpixel 111 or include a pigment having the first color in the overcoat layer 190.

The wavelength conversion layer 170 may include the first quantum dot emitting light having the second color when irradiated with light having the first color from the emissive layer 150 in the second subpixel 112 expressing the second color and the second quantum dot emitting light having the third color when irradiated with light having the first color from the emissive layer 150 in the third subpixel 113 expressing the third color.

The types of the quantum dots included in the wavelength conversion layer are not specifically limited. The wavelength conversion layer may include a monolayer quantum dot including at least one of a nanocrystal of group III-V semiconductor and a nanocrystal of group II-VI semiconductor or a multilayer quantum dot including a core/shell structure.

The quantum dot is a nanoparticle having a photoluminescence (PL) characteristic in which an electron excited to a higher energy level by external light emits light while returning to a lower energy level. This characteristic of the quantum dot may be used to convert the wavelength of light emitted from a light source of a display device. In particular, the quantum dot is characterized by emitting light having different wavelengths depending on the diameter. Thus, it is possible to advantageously use the quantum dot in the fabrication of a display device having high color purity by precisely controlling the size of the quantum dot during the fabrication thereof. Although the quantum dot has a problem of low conversion efficiency in PL emission, aspects of the present disclosure can overcome this problem.

A black matrix 115 may be located on the second transparent layer 160. The black matrix 115 may be located to correspond to the first subpixel 111, the second subpixel 112, and the third subpixel 113. The black matrix 115 may be located at boundaries of the subpixels so as to prevent color mixing from occurring between the subpixels.

The second reflector 180 is located on the wavelength conversion layer 170.

The second reflector 180 may be, for example, an encapsulation layer encapsulating circuit components provided on the substrate 110. The type of the second reflector 180 is not specifically limited as long as the second reflector can reflect light having the first color, light having the second color, and light having the third color while being able to protect the circuit components from external oxygen and moisture. For example, the second reflector 180 may be implemented as a metal layer made from aluminum (Al) or the like.

The first color may be blue, the second color may be green, and the third color may be red. In this example, the display panel 100 may be configured such that blue light is emitted from the emissive layer 150, the first subpixel 111 is a subpixel expressing blue, the second subpixel 112 is a subpixel expressing green, due to blue light being converted into green light in the wavelength conversion layer 170, and the third subpixel 113 is a subpixel expressing red, due to blue light being converted into red light in the wavelength conversion layer 170.

Figure 3:
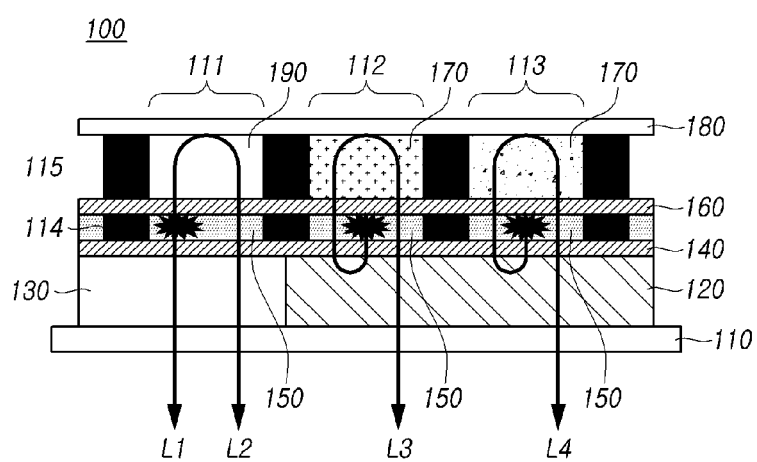

FIG. 3 is a schematic view illustrating the cross-sectional shape of the display panel according to aspects of the present disclosure. FIG. 3 is intended to illustrate a path along which light emitted from the emissive layer 150 travels.

Referring to FIG. 3, in the display panel 100 according to aspects of the present disclosure, the substrate 110 may be a viewer-side substrate. Thus, light emitted from the emissive layer 150 may pass through the substrate 110 to display an image.

Since both the first electrode 140 and the second electrode 160, i.e., two electrodes of the light-emitting device, are transparent electrodes, a portion L1 of light emitted from the emissive layer 150 in the first subpixel 111 may exit the display panel 100 through the substrate 110, whereas another portion L2 of the light emitted from the emissive layer 150 of the first subpixel 111 may travel to the reflector 180, be reflected from the reflector 180, and then exit the display panel 100 through the substrate 110.

A portion L3 of light having the first color emitted from the emissive layer 150 in the second subpixel 112 may exit the display panel 100 through a reflection step in which the light portion L3 having the first color emitted from the emissive layer 150 in the second subpixel 112 strikes and is reflected from the first reflector 120, a wavelength conversion step in which the light portion having the first color reflected from the first reflector 120 is converted into light having the second color while traveling through the wavelength conversion layer 170, striking and being reflected from the second reflector, and being directed to the first reflector, and an extraction step in which the light converted in the wavelength conversion step exits the display panel 100 by passing through the first reflector 120 and the substrate 110.

Since the display panel 100 includes the first transparent electrode 140 and the second transparent layer 160, i.e., the two transparent electrodes, and the first reflector 120 and the second reflector 180, i.e., the two reflectors, light, such as the light portion L3, which is not directed to the wavelength conversion layer 170, may also be converted in the wavelength conversion layer 170. Consequently, the display panel 100 may have high luminance.

Although not shown in FIG. 3, another portion of the light emitted from the emissive layer 150 may directly travel to the wavelength conversion layer 170 depending on the light travel path so as to exit the display panel 100 through the wavelength conversion step and the extraction step without the reflection step.

Although not shown in FIG. 3, a light portion not converted into light having the second color in the wavelength conversion step may strike and be reflected from the first reflector 120 to reenter the wavelength conversion layer 170, thereby being subjected again to the wavelength conversion step.

A portion L4 of light emitted from the emissive layer 150 in the third subpixel 113 may also exit the display panel 100 after having been converted into light having the third color through the reflection step, the wavelength conversion step, and the extraction step, in the same manner as the light portion L3 emitted from the emissive layer 150 in the second subpixel 112. In addition, a light portion not converted into light having the third color in the wavelength conversion step may also reenter the wavelength conversion layer 170 so as to be subjected again to the wavelength conversion step.

As described above, the display panel 100 according to aspects of the present disclosure includes the first transparent electrode 140 and the second transparent layer 160, i.e., the two transparent electrodes, and the first reflector 120 and the second reflector 180, i.e., the two reflectors. Since the first reflector 120 selectively reflects light having a specific color, the wavelength conversion layer 170 enables non-converted light to be reused. Accordingly, the display panel 100 may have high luminance.

FIGS. 4 to 11 are views illustrating a method of fabricating the display panel according to aspects of the present disclosure.

In the display panel 100 according to aspects of the present disclosure, the wavelength conversion layer may be formed after circuit components are formatted on the substrate, thereby preventing the quantum efficiency of quantum dots from being reduced due to, for example, high temperature deformation.

Figure 4:
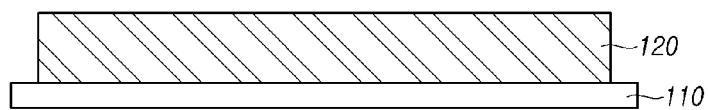
FIGS. 4 to 11 are schematic views illustrating a method of fabricating the display panel according to aspects of the present disclosure.

Referring to FIG. 4, the first reflector 120 is formed on the substrate 110. The first reflector 120 may be formed by, for example, chemical vapor deposition (CVD).

Figure 5:
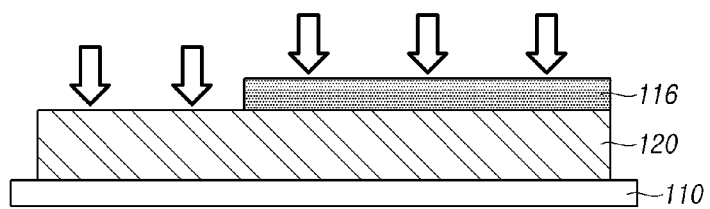

Referring to FIG. 5, the first reflector 120 may be patterned by etching using a photoresist 116 formed on the first reflector 120. Due to the patterning, the first reflector 120 may have a hole.

Figure 6:
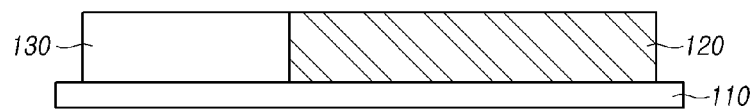
Figure 7:
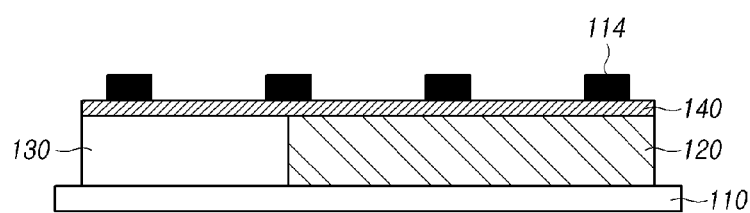

FIG. 6 illustrates the planarization layer 130 occupying the hole of the first reflector 120. FIG. 17 illustrates the first transparent electrode 140 formed after the planarization and the bank layer 114 formed on the first transparent electrode 140.

Figure 8:
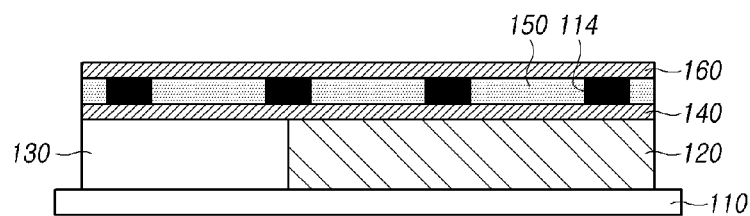
Figure 9:
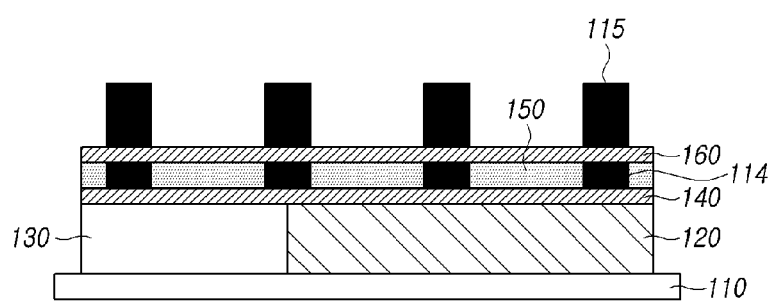

FIG. 8 illustrates the emissive layer 150 formed on the first transparent electrode 140 and the second transparent layer 160 formed on the emissive layer 150. FIG. 9 illustrates the black matrix 115 formed on the second transparent layer 160.

Figure 10:
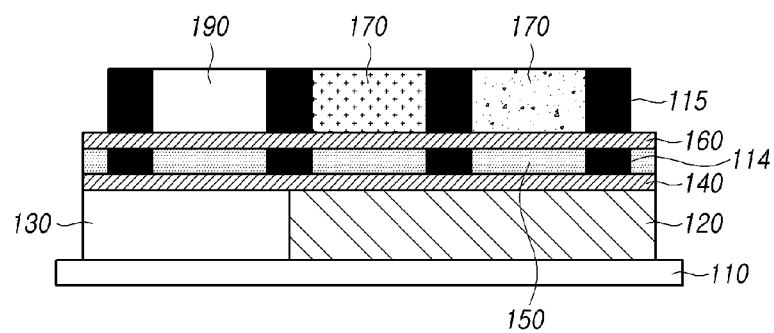
Figure 11:
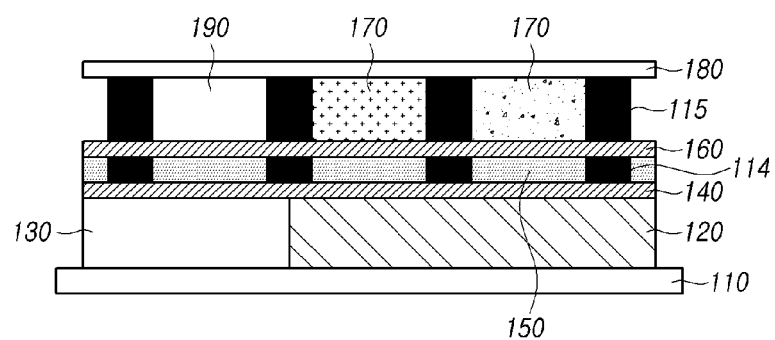

FIG. 10 illustrates the wavelength conversion layer 170 and 190 by, for example, inkjet printing after the black matrix 115 is formed. For example, the wavelength conversion layer 170 may include a quantum dot. Afterwards, as illustrated in FIG. 11, the second reflector 180 may be formed, thereby fabricating the display panel according to aspects of the present disclosure.

As illustrated in FIGS. 4 to 11, in the display panel according to aspects of the present disclosure, the wavelength conversion layer 170 including the quantum dots deformable at high temperature is formed after the fabrication of the circuit components performed at relatively high temperature. Accordingly, it is possible to prevent the performance of the wavelength conversion layer 170 from being degraded during the fabrication of the wavelength conversion layer 170.

In another aspect, aspects of the present disclosure may provide a display device including the display panel and a controller driving the display panel.

The display device may include the display panel and the controller controlling the display panel.

In the display device according to aspects of the present disclosure, details of the display panel are the same as those of the display panel according to aspects of the present disclosure described above. Thus, a description of the display panel included in the display device according to aspects of the present disclosure will be omitted.

In the display device according to aspects of the present disclosure, details of the controller driving the display panel are the same as those described above, and thus, a description thereof will be omitted.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display panel comprising:
a substrate on which a first subpixel expressing a first color, a second subpixel expressing a second color, and a third subpixel expressing a third color are defined;
a first reflector located on the substrate and having a hole corresponding to the first subpixel;
a planarization layer located on the substrate and occupying the hole;
a first transparent electrode located on the first reflector and the planarization layer;
an emissive layer located on the first transparent electrode and emitting light having the first color in the first subpixel, the second subpixel and the third subpixel;
a second transparent electrode located on the emissive layer;
a wavelength conversion layer located on the second transparent electrode, converting light having the first color into light having the second color in the second subpixel and converting light having the first color into light having the third color in the third subpixel; and
a second reflector located on the wavelength conversion layer,
wherein the first reflector reflects light having the first color and allows light having the second color and light having the third color to pass therethrough, and
wherein at least one of the first transparent electrode, the emissive layer and the second transparent electrode is disposed between the first reflector and the second reflector in a cross-sectional view.

2. The display panel according to claim 1, wherein the first reflector comprises a distributed Bragg reflector having refractive index layer pairs, each refractive index layer pair having a low refractive index layer and a high refractive index layer, and
wherein the low refractive index layer and the high refractive index layer are stacked on each other in an alternating manner.

3. The display panel according to claim 2, wherein the number of the refractive index layer pairs is 10 to 20.

4. The display panel according to claim 2, wherein a ratio of a thickness of the low refractive index layers with respect to a thickness of the high refractive index layers in the distributed Bragg reflector is about 2:1.

5. The display panel according to claim 1, wherein the wavelength conversion layer includes a first quantum dot in the second subpixel and a second quantum dot in the third subpixel.

6. The display panel according to claim 1, wherein the first color is blue, the second color is green, and the third color is red.

7. A display device comprising:
a display panel; and
a controller configured to drive the display panel,
wherein the display panel comprises:
a substrate on which a first subpixel expressing a first color, a second subpixel expressing a second color, and a third subpixel expressing a third color are defined;
a first reflector located on the substrate and having a hole corresponding to the first subpixel;
a planarization layer located on the substrate and occupying the hole;
a first transparent electrode located on the first reflector and the planarization layer;
an emissive layer located on the first transparent electrode and emitting light having the first color in the first subpixel, the second subpixel, and the third subpixel;
a second transparent electrode located on the emissive layer;
a wavelength conversion layer located on the second transparent electrode, converting light having the first color into light having the second color in the second subpixel and converting light having the first color into light having the third color in the third subpixel; and
a second reflector located on the wavelength conversion layer,
wherein the first reflector reflects light having the first color and allows light having the second color and light having the third color to pass therethrough, and
wherein at least one of the first transparent electrode, the emissive layer and the second transparent electrode is disposed between the first reflector and the second reflector in a cross-sectional view.

8. The display device according to claim 7, wherein the first reflector comprises a distributed Bragg reflector comprising refractive index layer pairs, each refractive index layer pair having a low refractive index layer and a high refractive index layer,
wherein the low refractive index layer and the high refractive index layer are stacked on each other in an alternating manner.

9. The display device according to claim 8, wherein the number of the refractive index layer pairs is 10 to 20.

10. The display device according to claim 8, wherein a ratio of a thickness of the low refractive index layers with respect to a thickness of the high refractive index layers in the distributed Bragg reflector is about 2:1.

11. The display device according to claim 7, wherein the wavelength conversion layer includes a first quantum dot in the second subpixel and a second quantum dot in the third subpixel.

12. The display device according to claim 7, wherein the first color is blue, the second color is green, and the third color is red.

\* \* \* \* \*